United States Patent [19]
Kalb et al.

[11] Patent Number: 5,706,163
[45] Date of Patent: Jan. 6, 1998

[54] ESD-PROTECTED THIN FILM CAPACITOR STRUCTURES

[75] Inventors: Jeffrey Clifford Kalb, Saratoga, Calif.; Bhasker B. Rao, Chandler, Ariz.

[73] Assignee: California Micro Devices Corporation, Milpitas, Calif.

[21] Appl. No.: 564,878

[22] Filed: Nov. 28, 1995

[51] Int. Cl.⁶ .............. H01G 4/06; H02H 3/20; H01L 21/265; H01L 23/62

[52] U.S. Cl. .......... 361/313; 361/91; 361/321.4; 361/321.5; 361/321.1; 257/355; 257/509; 257/528; 257/532; 437/47; 437/51; 437/60

[58] Field of Search ............ 361/311–314, 321.1–321.5, 361/91, 100–101; 257/355, 296, 306, 528, 532, 509; 437/47, 51, 60, 919

[56] References Cited

U.S. PATENT DOCUMENTS

| | | | |
|---|---|---|---|
| 3,775,838 | 12/1973 | Dalmasso | 29/577 |
| 4,377,029 | 3/1983 | Ozawa | 29/576 B |
| 4,736,271 | 4/1988 | Mack et al. | 361/91 |
| 4,758,873 | 7/1988 | Monticelli | |
| 4,937,660 | 6/1990 | Dietrich et al. | |
| 5,246,872 | 9/1993 | Mortensen | 437/51 |
| 5,264,723 | 11/1993 | Strauss | 257/532 |
| 5,355,014 | 10/1994 | Rao et al. | 257/533 |
| 5,370,766 | 12/1994 | Desaigoudar et al. | 156/643 |
| 5,406,105 | 4/1995 | Lee | 257/355 |
| 5,514,612 | 5/1996 | Rao et al. | 437/51 |

*Primary Examiner*—Bot L. Ledynh
*Attorney, Agent, or Firm*—Hickman Beyer & Weaver

[57] ABSTRACT

A thin film protected capacitor structure having a thin film capacitor and a protection device is provided on an integrated circuit wafer. The wafer has a low resistivity substrate of a first type disposed under an epitaxial layer of a second type different from the first type. The structure includes a first heavily doped region, which is of the first type, in and through the epitaxial layer, and an oxide layer having a first oxide region disposed above the first heavily doped region. The first heavily doped region and the low resistivity substrate form the first plate of the thin film capacitor. There is also included a metal layer disposed above the first oxide region. A portion of this metal layer forms the second plate of the thin film capacitor. Between the second plate and the first plate, the aforementioned first oxide region represents the insulating dielectric. There is also included a second heavily doped region in the epitaxial layer. This second heavily doped region, being of the first type and in electrical contact with the metal layer, has a thickness that is less than the thickness of the epitaxial layer. The protection device is formed from this second heavily doped region, the epitaxial layer, and the low resistivity substrate.

26 Claims, 6 Drawing Sheets

ESD-PROTECTED THIN FILM CAPACITOR STRUCTURES

BACKGROUND OF THE INVENTION

The present invention relates generally to capacitors. More particularly, the present invention relates to thin film capacitors which are protected against electrostatic discharge.

Capacitors are known in the art. Traditionally, capacitors are constructed by placing a relatively thick layer of dielectric between two conducting plates. By way of example, older generation thin film capacitors have a layer of oxide or a combination of oxide and nitride about 2,000 angstrom thick as the insulating dielectric. Thick film capacitors would have a dielectric thickness of even ten times greater than this. Such thick film capacitors are usually relatively immune to electrostatic discharge (ESD) damage. This is because a capacitor's breakdown voltage is proportional to the thickness of its dielectric layer according to the formula:

$$BV = L \times D$$

where L is the dielectric strength and D is the thickness of the insulating dielectric layer. It is not uncommon for thick film capacitors having a fairly thick dielectric layer to have an intrinsic breakdown voltages of hundreds of volts, and electrostatic discharge protection value of up to 1,000 volts.

However, the trend toward miniaturization requires that components, such as capacitors, on a circuit board be increasingly miniaturized. It is known that a capacitor's capacitance is proportional to the area of the plates (A) and the dielectric constant (K) of the insulating material, and inversely proportional to the distance between the plates (d) according to the formula:

$$C = K \times (A/d).$$

Consequently, there are essentially three ways to increase a capacitor's capacitance: 1) find some dielectric material that provides more capacitance per unit area without degrading the breakdown characteristics, 2) increase the area of the plates, and 3) make the dielectric film thinner. If the same dielectric material is used, increasing the area of the plates is usually uneconomical when capacitors are fabricated as part of an integrated circuit on a silicon die since die space is very expensive. Reducing the thickness of the dielectric film has the advantage of both increasing the amount of capacitance and reducing the size of the capacitor. Known as thin film capacitors, these devices have the ability to be integrated in very close proximity with other devices, such as resistors.

However, as the thickness of the insulating dielectric layer is reduced, the resulting capacitor becomes more susceptible to electrostatic discharge (ESD) energy. This is because the breakdown voltage of a capacitor, as mentioned earlier, diminishes as the film of dielectric is thinned. If electrostatic energy gets discharged across an unprotected thin film capacitor, dielectric damage or outright destruction of the device can result.

To protect thin film capacitors against ESD-related damages, there is typically provided a protection mechanism that furnishes a parallel discharge path to protect the layer of insulating dielectric in the event the entire structure experiences ESD discharge. The protection device typically has a breakdown voltage which is suitably below that of the capacitor dielectric itself. ESD energy then gets dissipated in the parallel discharge path through the protection device before it can damage the insulating dielectric layer.

Figure 1:
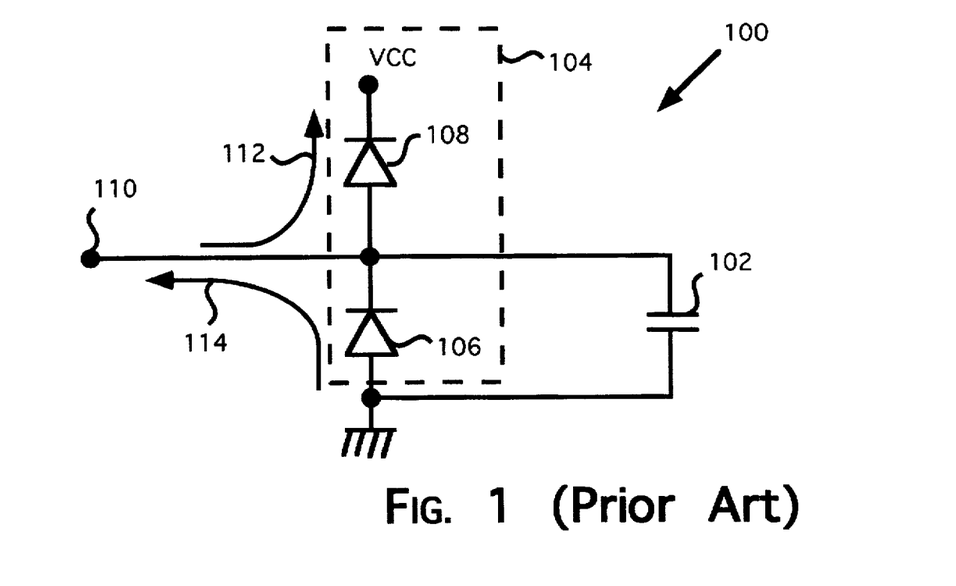
FIG. 1 illustrates a prior art capacitor structure which utilizes a diode to protect against electrostatic discharge.

FIG. 1 shows, for illustration purposes, a prior art I.C. protection device as applied to a single capacitor structure 100 including capacitor 102, and protection device 104. Protection device 104 includes diodes 106 and 108 in series between ground and Vcc. When the potential at pin 110 is highly positive, e.g., due to the presence of electrostatic discharge energy, current is discharged through path 112. Alternatively when pin 110 is highly negative, current is discharged through path 114. In this manner, destructive current is discharged through protective device 104 before damage to the insulating dielectric layer within capacitor 102 could occur. However, the thin film ESD-protected capacitor structure 100 of FIG. 1 only looks like a capacitor when the applied voltage is between Vcc and ground. Further voltage swings forward bias the diodes and destroy the effectiveness of the capacitor. This represents a significant disadvantage. Further, an extra pin is required (for Vcc) in order to protect capacitor 102. For most applications, the extra pin requirement is highly undesirable, as standard capacitors do not come with power supply pins.

Figure 2:
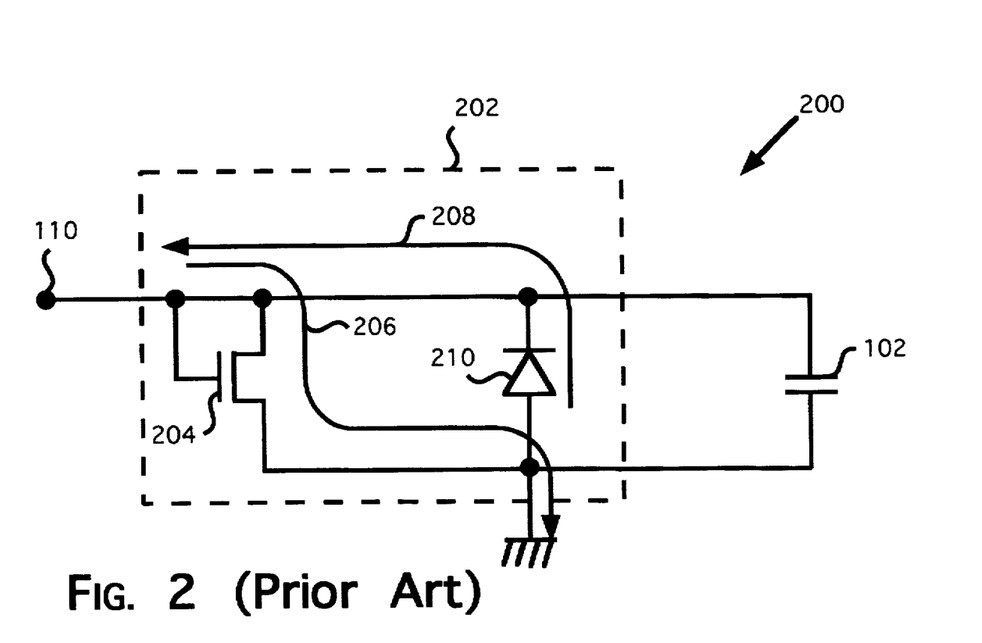
FIG. 2 illustrates another prior art capacitor structure which utilizes an n-channel transistor to protect against electrostatic discharge.

FIG. 2 shows, for illustration purposes, another prior art capacitor structure, including thin film capacitor 200 and protection device 202. Protection device 202 includes an n-channel transistor 204, which typically has a high threshold voltage, say 12 to 20 volts. When the potential of pin 110 is above the threshold voltage of n-channel transistor 204, it turns on transistor 204 to discharge current along path 206. When the potential at pin 110 is below ground, current is discharged through path 208 via a diode 210. However, this prior art ESD protection scheme of FIG. 2 is unipolar, i.e., it can only be used for voltages above ground, which is undesirable for many applications.

Further, the processes currently available for manufacturing these prior art protection devices in combination with thin films impose the requirement that connections to the capacitor be surface-oriented. This inserts unwanted resistance and inductance in series with the capacitor, which deteriorates performance at higher frequencies. It also puts significant non-linear capacitance into the circuit because of the effects of the protection device. This poor high frequency characteristic renders the prior art capacitor structure particularly unsuitable for use in modern high speed circuitries.

In view of the foregoing, what is desired is a thin film ESD-protected capacitor structure that does not have forward conduction in either direction, e.g., can be polarized either way within a useful voltage range, but still can offer good ESD protection. The improved thin film ESD-protected capacitor structure preferably maximizes the high frequency characteristics while lending itself to cost-effective semiconductor and thin film manufacturing techniques.

SUMMARY OF THE INVENTION

The invention relates to thin film capacitors and ESD-protected thin film capacitor structures. In one embodiment, an improved electrostatic discharge protection mechanism is provided to protect the thin dielectric layer of the improved thin film capacitor from electrostatic-related damage.

Further, the present invention advantageously facilitates the fabrication of both the improved thin film capacitor and protection device, using traditional semiconductor and thin film processes, in an efficient and cost-effective manner. Because of its novel structure, the improved thin film capacitor advantageously minimizes the series resistance and inductance and maximizes high frequency characteristics.

The invention relates, in one embodiment, to a thin film protected capacitor structure having a thin film capacitor and a protection device. The thin film protected capacitor structure is fabricated on a low resistivity silicon wafer that has an epitaxial layer on it. The low resistivity substrate is of a first type and the epitaxial layer is of a second type different from the first type.

The thin film protected capacitor structure includes a first heavily doped region, which is of the first type, in and through the epitaxial layer. There is further included an oxide layer having a first oxide region disposed above the first heavily doped region. When so disposed, the first heavily doped region is in electrical contact with both the first oxide region and the low resistivity substrate to form a conducting path between the underside of the first oxide region and the low resistivity substrate through the epitaxial layer. In this structure, the first heavily doped region and the low resistivity substrate represent the first plate of the thin film capacitor.

The thin film protected capacitor structure also includes a metal layer disposed above the first oxide region. A portion of this metal layer forms the second plate of the thin film capacitor. Between the second plate and the aforementioned first plate, the first oxide region represents an insulating dielectric.

There is further included a second heavily doped region formed in the epitaxial layer. The second heavily doped region has a thickness that is less than the thickness of the epitaxial layer. This second heavily doped region is of the first type and in electrical contact with the metal layer. The protection device is formed by this second heavily doped region, the epitaxial layer, and the low resistivity substrate.

The invention also relates to a method for fabricating a thin film protected capacitor structure on an integrated circuit wafer, which has an epitaxial layer on a low resistivity substrate. The low resistivity substrate is of a first type while the epitaxial layer is of a second type different from the first type. The inventive method includes the step of implanting dopants of the first type into a first region of the epitaxial layer, thereby forming a first heavily doped region in and through the epitaxial layer. The first heavily doped region is of the first type and in electrical contact with the low resistivity substrate.

Further, the method includes the step of forming an oxide layer having a first oxide region disposed above the first heavily doped region. Additionally, there is provided the step of forming a metal layer having a first metal region disposed above the first oxide region. In this manner, the first metal region represents a first plate of a thin film capacitor of the thin film protected capacitor structure while the first oxide region represents an insulating dielectric layer of the thin film capacitor, and both the first heavily doped region and the low resistivity substrate represent a second plate of the thin film capacitor.

The method includes the additional step of implanting dopants of the first type into a second region of the epitaxial layer, thereby forming a second heavily doped region in the epitaxial layer. In this embodiment, the second heavily doped region is of the first type and having a thickness that is less than the thickness of the epitaxial layer. Additionally, there is provided in this embodiment the step of electrically isolating a first epitaxial region of the epitaxial layer from other regions of the epitaxial layer. The first epitaxial region is disposed under the second heavily doped region. Furthermore, the method of this embodiment includes the step of electrically coupling a second region of the metal layer to the second heavily doped region, whereby the second heavily doped region, the first epitaxial region, and the low resistivity substrate form a protection device of the thin film protected capacitor structure.

BRIEF DESCRIPTION OF THE DRAWINGS

Additional advantages of the invention will become apparent upon reading the following detailed description and upon reference to the drawings, in which.

DETAILED DESCRIPTION OF THE INVENTION

FIGS. 1 and 2 show, for illustration purposes, prior art ESD-protected capacitor structures.

Figure 3:
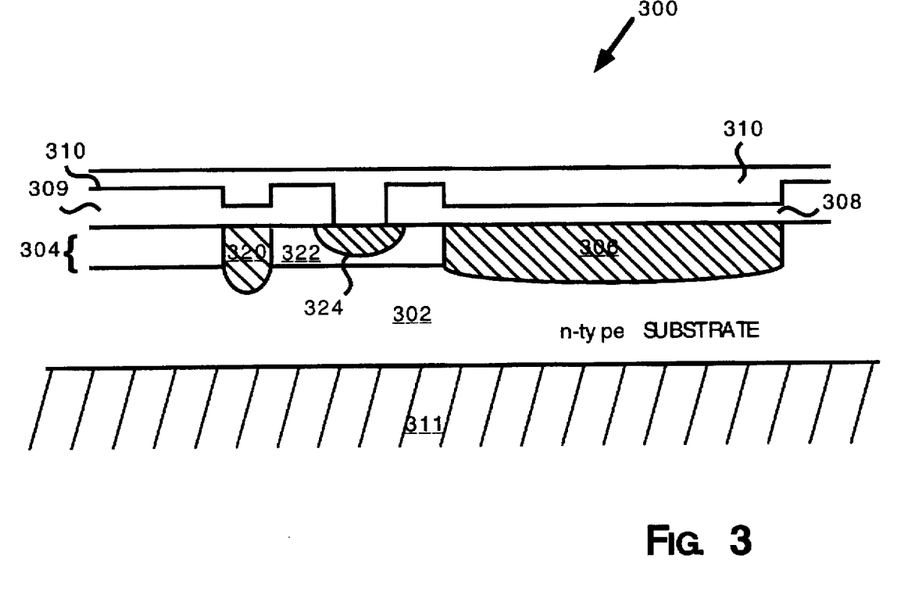
FIG. 3 shows, for illustration purposes, an improved thin film ESD-protected capacitor structure in accordance with one embodiment of the present invention.

FIG. 3 shows, for illustration purposes, an improved thin film ESD-protected capacitor structure 300 in accordance with one embodiment of the present invention. Referring now to FIG. 3, there is shown a high concentration low resistivity n++ substrate 302. Substrate 302 represents a substantially uniformly doped substrate. It should be borne in mind that although substrate 302 is shown to be an n-type substrate, all polarities of the inventive thin film ESD-protected capacitor structure disclosed herein may be reversed if desired. Further, although the structures shown in FIG. 3 are substantially iso-planar, e.g., fabricated via a traditional planar process such as a metal gate process (MOS) process, the important structures may well be fabricated using an iso-planar process, e.g., one of the localized oxidation processes such as the localized oxidation of silicon (LOCOS) or possibly some other variant.

There is disposed above substrate 302 a p-type epitaxial layer (epi layer) 304. Epi layer 304 is typically much thinner than substrate 302 (say, 5 microns versus 20 mils). Keep in mind that the terms "above" and "under" are used herein to indicate the relative, not absolute, spatial relationship between two physical entities.

A heavily doped region 306 is created in and through epi layer 304 to short out the thin epi layer 304, thereby creating a localized contact through. This heavily doped n++ region 306 is in electrical contact with substrate 302 and forms one plate of the thin film capacitor. In one embodiment, heavily doped n++ region 306 represents a diffused region whose thickness varies depending on the thickness of epi layer 304. In one embodiment, the heavily doped n++ region has a thickness of say, 5 microns (versus 20 mils for substrate 302). However, in another embodiment, the thickness of the epi and the heavily doped n++ region 306 may well be down to 3 microns or below, and in another it could be above 6 microns.

The low resistivity substrate 302 serves as the conduit through which low impedance access to heavily doped n++ region 306 and the bottom of capacitor oxide layer 308 may be made from the backside contact 311. Backside contact 311 represents a low resistance contact and employs, in one embodiment, silver epoxy die attach, but there are many standard ways in which this could be accomplished.

Above heavily doped n++ region 306, there is disposed a thin layer of capacitor oxide 308, representing the dielectric of the thin film capacitor. A metal layer 310 is disposed above capacitor oxide layer 308. Metal layer 310 provides both the contact to the protection device and a plate for the thin film capacitor. Other materials can be deposited on the surface of the device to form resistors or inductors, with the metal serving to interconnect all the devices.

An optional heavily doped n++ isolation region 320 is formed simultaneously with region 306 but left under oxide layer 309 to isolate p-type region 322 from the rest of epi layer 304. A protection device is then built within and from this p-type region 322. In this p-type region 322, another heavily doped n++ region 324 is created. This heavily doped n++ region 324 has a thickness that is less than the thickness of epi layer 304. Electrical contact is made to metal layer 310 from heavily doped n++ region 324.

The resulting protection device is essentially an epi-based diffused transistor structure comprising heavily doped n++ region 324, p-type region 322, and substrate 302. In principle, the n-p-n structure of the protection device is similar to a transistor. In the present embodiment, however, the thickness of epi layer 304 is chosen to be thick enough so that transistor action is minimal. For example, instead of creating a structure with a narrow basewidth to create gain, the protection structure that results has, for example, a wide basewidth with essentially no gain to function as a breakdown mechanism. In the presence of high voltage, such as that generated by electrostatic discharge, the n-p-n structure will breakdown in either polarity and the protection device goes into avalanche mode, thereby protecting the capacitor with a relatively low impedance bypass.

With reference to FIG. 3, when the potential attached to metal layer 310 is highly positive, the heavily doped n++ region 324 breaks down through p-type region 322 and the current is taken out through backside contact 311 via substrate 302. If the voltage on metal layer 310 is highly negative, substrate 302 breaks down through p-type region 322 and is taken out through metal layer 310 via heavily doped n++ region 324.

As discussed earlier, the lower plate of the thin film capacitor (the capacitor includes metal layer 310, capacitor oxide layer 308, and the conducting path formed by heavily doped n++ region 306 and substrate 302) is contacted from backside contact 311. The ability to contact the thin film capacitor from the backside of the wafer advantageously minimizes the series resistance and series inductance of the capacitor while achieving a low-cost and reliable structure. This is in contrast to surface-oriented capacitor structures where surface contacts are almost always around the periphery of the capacitor for at least one plate, creating high series resistance to the center of the capacitor area. Consequently, a non-linear resistor capacitor combination results.

Further, topside contacts also tend to have long surface metal connections, which are themselves inductive and resistive since they are essentially parallel narrow thin wires (e.g., one micron thick and say, 5–10 microns wide) that contribute a lot of inductance and resistance in series with the capacitance. As a result, the structure undesirably behaves more like an inductor than a capacitor beyond a certain frequency.

In the present invention, since substrate 302 is chosen to be very low resistance, and heavily doped n++ region 306 has a high dopant concentration, the series resistance of the capacitor through these layers can be kept quite low and the inductance through this portion of the device will be essentially zero as the length to area ratio of these conducting regions is very small. Additionally, when the contact is made from the backside, the bonding wires for connecting from the device leads to the capacitor can be made shorter to minimize inductance, and the heavier lead frame material can be used for most of the conductive path. Consequently, the inventive technique facilitates low resistance, low inductance connections necessary to build a high performance device. In fact, it is contemplated that the low inductance feature of the inventive thin film ESD-protected capacitor structure advantageously permits the structure to remain functional at frequencies approaching 3 gigahertz or higher.

Figure 4:
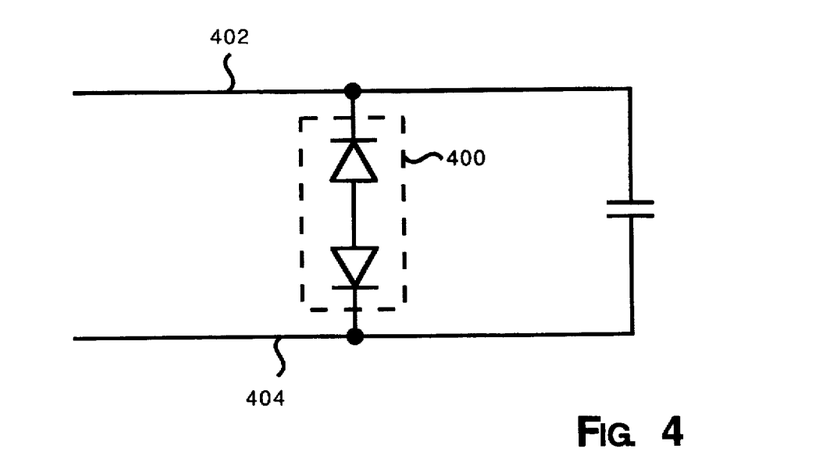
FIG. 4 shows the equivalent circuit model of the inventive thin film ESD-protected capacitor structure.

FIG. 4 shows the equivalent circuit model of the inventive thin film ESD-protected capacitor structure. As shown in FIG. 4, the protection device is essentially a back-to-back diode structure, one end of which represents substrate 302, and the other end represents heavily doped n++ region 324 of FIG. 3. Conductor 402 represents metal layer 310 while conductor 404 represents backside contact 311 of FIG. 3.

Figure 5:
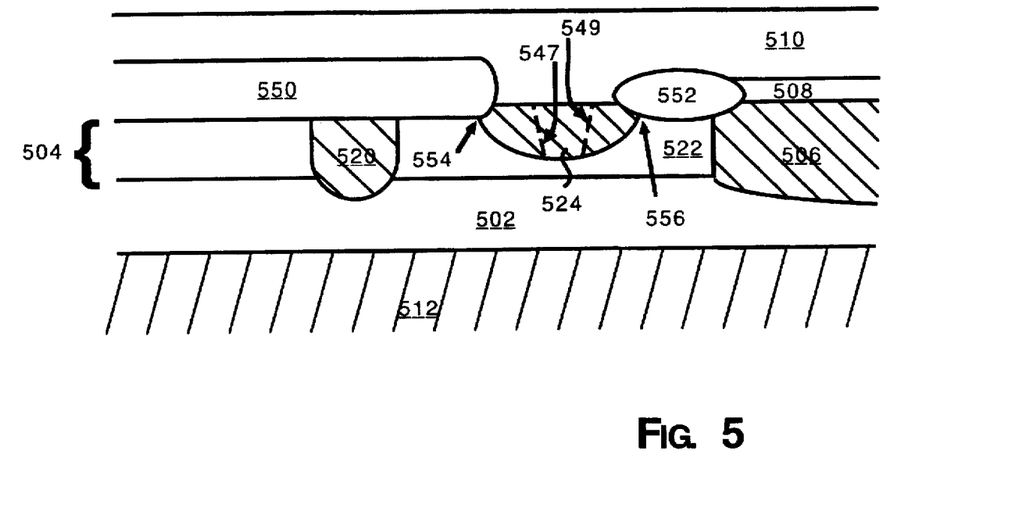
FIG. 5 illustrates a thin film ESD-protected capacitor structure which is fabricated using a local oxidation technique.

As mentioned earlier, the inventive thin film ESD-protected capacitor structure, including the thin film capacitor and the protection device, may also be fabricated using a local oxidation technique. FIG. 5 shows, for illustration purposes, such a thin film ESD-protected capacitor structure. In FIG. 5, the capacitor comprises metal layer 510, capacitor oxide layer 508, and the contact through the epi layer comprising heavily doped n++ region 506 and low resistivity substrate 502. In one embodiment, substrate 502 is doped with a suitable dopant (such as antimony or arsenic for an n-type substrate) and has a resistance in the range of about 0.005 to 0.025 Ω-cm or preferably even lower. Likewise, heavily doped n++ region 506 is doped with a suitable dopant (such as phosphorus for an n-type region) and has a surface dopant concentration in the range of about $10^{19}$ atoms per cubic cm. Again, the exact level is not as important as guaranteeing a low resistance connection to substrate 502.

Backside contact 512 represents the contact to one plate of the capacitor while metal layer 510 represents the other plate. Metal layer 510 may be created by depositing (via sputtering, for example) a suitable conducting material such as aluminum. Similarly, backside contact 512 is created by using traditional low resistance backside conductor wafer preparation techniques, of which there are many.

The protection device comprises heavily doped n++ region 524, p-type region 522, and substrate 502. Heavily doped n++ region 524 is in electrical contact with metal layer 510. Heavily doped n++ region 524 is doped with a suitable dopant (such as arsenic or phosphorus for an n-type region) and has a surface dopant concentration of about $10^{19}$ atoms per cubic cm. P-type region 522 is a portion of epi layer 504, which can have a resistivity in the range of about 0.3 Ω-cm to about 5 Ω-cm depending on the desired breakdown characteristics.

FIG. 5 also shows an optional heavily doped n++ isolation region 520 under locally grown oxide region 550. Heavily doped n++ isolation region 520 separates p-type region 522 from the remainder of epitaxial layer 504. Heavily doped n++ isolation region 520 is doped with a suitable dopant (such as phosphorus for an n-type region) and is similar in concentration to region 506 as it would typically be done at the same time.

The protection device is designed to breakdown when the potential difference between metal layer 510 and backside 512 exceeds a certain threshold, which is suitably above the operating range of the thin film capacitor but suitably below the threshold that may cause damage to oxide layer 508. In operation, if the voltage on metal layer 510 is highly positive, heavily doped n++ region 524 breaks down through p-type region 522 in epi layer 504, and current is taken out through backside contact 512 via substrate 502. Alternatively, if the potential level on metal layer 510 is highly negative, substrate 502 breaks down through p-type region 522 and current is taken out through metal layer 510 via heavily doped n++ region 524. In this manner, bipolar protection is provided.

In one embodiment, heavily doped n++ region 524 is made smaller in size so that it is placed in a spaced-apart relationship and therefore does not contact either locally grown oxide region 550 or locally grown oxide region 552. This smaller embodiment of heavily doped n++ region 524 is shown, for example, by the region between dotted lines 547 and 549 in FIG. 5. When heavily doped n++ region 524 is formed without contacting the edges of regions 550 or 552, sharp corners 554 and 556 may be avoided, potentially increasing the breakdown voltage of the protection device.

In one embodiment, the protection device is made annular. In other words, the heavily doped n++ region 524 and p-type region 522 are essentially round when viewed from the top. However, it is contemplated that structures having other geometric shapes, e.g., square structures, elongated structures with rounded ends, or other structures may well be employed. Again, it should be noted that although the substrate 502 is shown to be an n-type substrate, all polarities of the inventive thin film ESD-protected capacitor structure of FIG. 5 may be reversed if desired.

Due to the flexibility inherent in the semiconductor manufacturing processes employed, the thin film ESD-protected capacitor structure of the present invention can be independently optimizable with respect to either its thin film capacitor or its protection device. Such optimization may be achieved by, for example, appropriately controlling the thickness of each layer of the structure or the diffusion/implantation parameters using techniques known in the art.

Unlike the prior art thin film technology, the present invention is also capable of optimizing, via the fabrication process, the breakdown voltage of the protection device so that, for example, protection can be obtained equally in both polarities. This allows the oxide dielectric, which is bipolar in its breakdown voltage, to be thinned down while being protected in both directions. Consequently, the thickness of the insulation dielectric layer may be reduced to a greater degree, without sacrificing ESD protection.

Figure 6A:
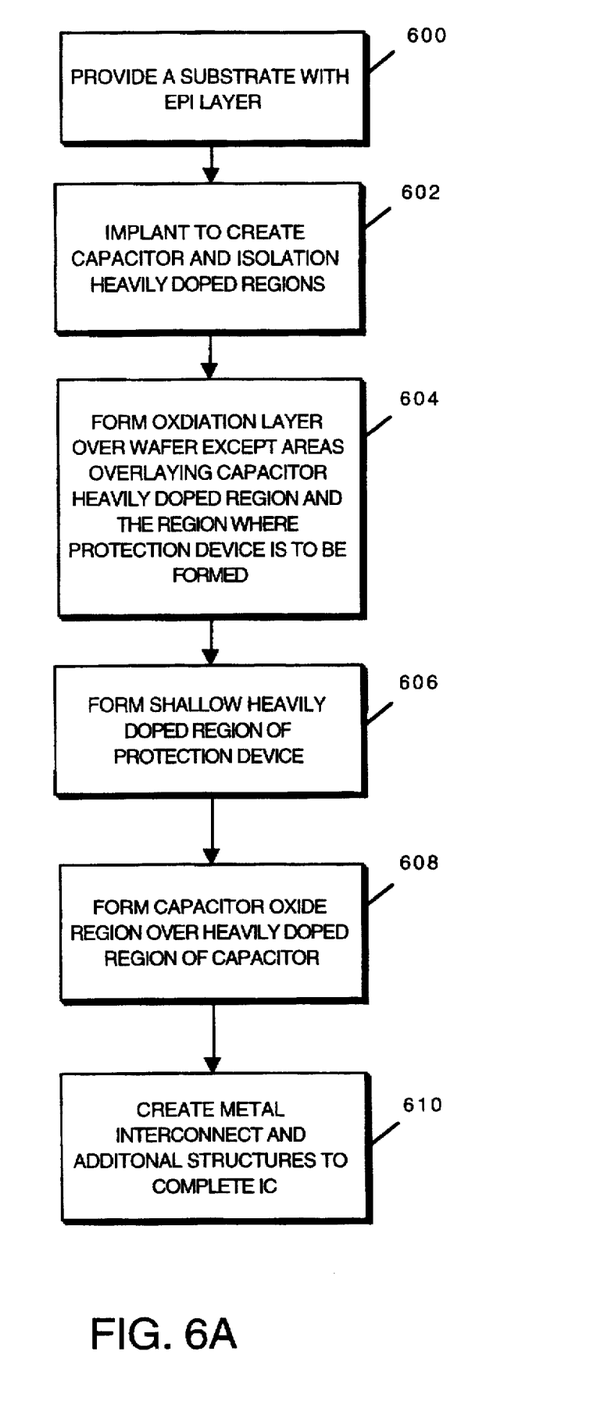
FIG. 6A shows, for illustration purposes, the process steps involved in creating the thin film ESD-protected capacitor structure of FIG. 5.

FIG. 6A shows, for illustration purposes, the process steps involved in creating the thin film ESD-protected capacitor structure of FIG. 5. Bear in mind that the process steps of FIG. 6A are merely illustrative and that the thin film ESD-protected capacitor structure may be fabricated using any known fabrication techniques, including those involving localized oxidation of silicon (LOCOS) and their variations, traditional metal gate processes (MOS), bipolar processes, and the like. Accordingly, the process steps and parameters shown in FIG. 6A are detailed herein to facilitate understanding and are in no way limiting, but serve to show possible implementation methods.

In step 600, a suitable substrate having thereon an epitaxial layer is provided. In the preferred embodiment, the substrate represents a heavily doped n-type substrate having a resistivity of about 0.005 to about 0.025 Ω-cm. The preferred epitaxial layer is a p-type epitaxial layer (epi layer) about 5 micron thick. In FIG. 5, the substrate and the p-epi layer are shown as substrate 502 and p-epi layer 504, respectively.

To facilitate the localization of implantation step 602, a nitride sinker mask is created and etched down to the epi layer prior to implantation. Since nitride is a mismatch to silicon and may create stress if placed directly thereon, a thin lubrication layer of oxide may be provided between the epi layer and the nitride sinker mask layer.

The patterning via etching of the nitride layer is accomplished using a conventional photoresist technique. By way of example, one such photoresist technique involves the application of a resist material, the exposure of the resist in a contact or stepper lithography system, and the development of the resist to form a mask to facilitate subsequent nitride etching.

In one embodiment, the photoresist mask is left on in areas that are not etched to serve as an extra protection layer over regions in which n++ implantation (performed in step 602) is not desired. This extra protection layer is especially advantageous if the nitride mask layer is relatively thin.

In step 602, the deep, heavily doped n++ regions of the thin film capacitor and the optional isolation region, e.g., regions 506 and 520 of FIG. 5, are implanted. In the preferred embodiment, phosphorous is used as the dopant material although other suitable dopants may well be employed. The implantation is preferably performed at a fairly high energy level to cause the dopants to penetrate well into the silicon.

An n-well drive step may also be performed subsequent to the n++ implantation of step 602. N-well drive involves, for example, heating the wafer in a furnace to diffuse the n++ dopants through the p-epi layer to ensure the creation of a heavily doped n++ region that contacts the n-type substrate underneath.

Following step 602, the remaining photoresist and nitride masking materials are removed. Any silicon oxide that was formed during the n-well drive step is also removed.

To prevent the p-epi layer from being inverted when a potential is applied to it, the concentration of p-type dopants in the p-type epi layer may be increased by performing a p-field boost implantation using, for example, boron dopants. Prior to the p-field boost implantation, a nitride mask is preferably created, using a photoresist masking technique similar to that described in connection with step 602, to prevent the implantation of p-type dopants in two areas: 1) the portion of the epi layer where the shallow, heavily doped n++ region of the protection device will be created, and 2) the deep, heavily doped n++ region of the thin film capacitor. In FIG. 5, these two areas correspond to areas 524 and 506 respectively.

In step 604, a thick layer of oxide is grown over the entire structure except where there is nitride. As mentioned above, nitride masking is present to protect two areas: the shallow, heavily doped n++ region of the protection device, and the deep, heavily doped n++ region of the thin film capacitor. This field oxidation layer is relatively thick, say between 7,000 and 7,800 angstroms thick in one embodiment. The grown oxide areas correspond to regions 550 and 552 of FIG. 5.

Once the nitride mask is removed, the shallow, heavily doped n++ region of the protection device is formed in step 606. This shallow, heavily doped n++ region corresponds to region 524 of FIG. 5 and is preferably formed via phosphorous and/or arsenic implantation at a suitable implantation energy level. At the same time, this implant is allowed to go into region 506 to further increase the concentration of the n++ dopants therein.

In step 608, the capacitor oxide region is formed. This capacitor oxide layer corresponds to region 508 of FIG. 5. At the same time, oxide is grown over area 524 of FIG. 5. To facilitate electrical contact with the shallow, heavily doped n++ region 524 of the protection device, the oxide over this area 524 is then etched away using an appropriate photoresist mask.

In step 610, metal contacts and additional thin film structures such as resistors and/or inductors are then formed to complete the IC. It should be borne in mind that although n-type substrates and heavily doped regions are discussed herein for ease of illustration, all polarities of the inventive thin film ESD-protected capacitor structure disclosed herein may be reversed if desired. Further, the specific parameters associated with the examples discussed herein are merely illustrative and are in no way limiting. Given this disclosure, it should be apparent to those skilled in the art that the process and dimension parameters may vary from application to application and from process to process.

Figure 6B:
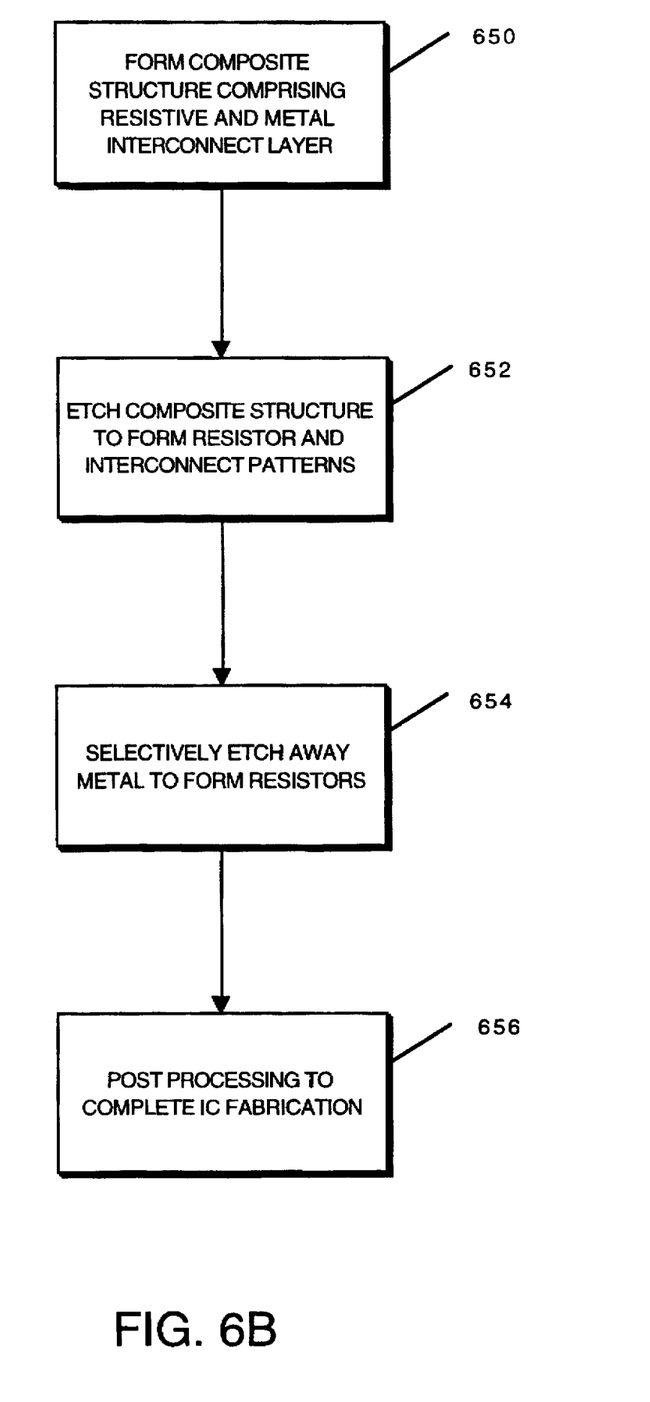
FIG. 6B illustrates the steps involved in creating the additional resistor structures to form a thin film ESD-protected RC network in accordance with one aspect of the present invention.

The thin film ESD-protected capacitor structure of the present invention may be combined with thin film resistors to form thin film ESD-protected RC networks. FIG. 6B illustrates the steps involved in creating the additional resistor structures to form a thin film ESD-protected RC network in accordance with one aspect of the present invention. These steps can be, for example, appended to those in FIG. 6A, starting after step 608. In step 650, a composite structure comprising a metal interconnect layer on top of a resistive layer is formed over the surface of the entire structure. The resistive and metal interconnect materials are preferably tantalum nitride and aluminum silicon copper respectively. In the preferred embodiment, this composite structure is formed by sputtering.

In step 652, the composite structure deposited in step 650 is etched using a conventional photoresist masking technique. The composite structure is etched down to the silicon oxide to create the patterns that form the resistors and metal interconnects. After the etching step 650, the resistors are formed but are essentially shorted out by the layer of aluminum silicon copper.

In step 654, the aluminum silicon copper is etched, using a conventional photoresist masking technique, through to the tantalum nitride to open up the shorted connections, thereby creating the resistors.

In step 656, additional post-processing steps, which are conventional in nature, are performed on the wafer die to complete the IC fabrication process. Examples of such post-processing steps include stabilization bake, industry standard nitride passivation deposition, masking, and etching, standard alloy process between the metal and the n++ heavily doped regions of the thin film capacitor, and parametric testing.

Figure 7:
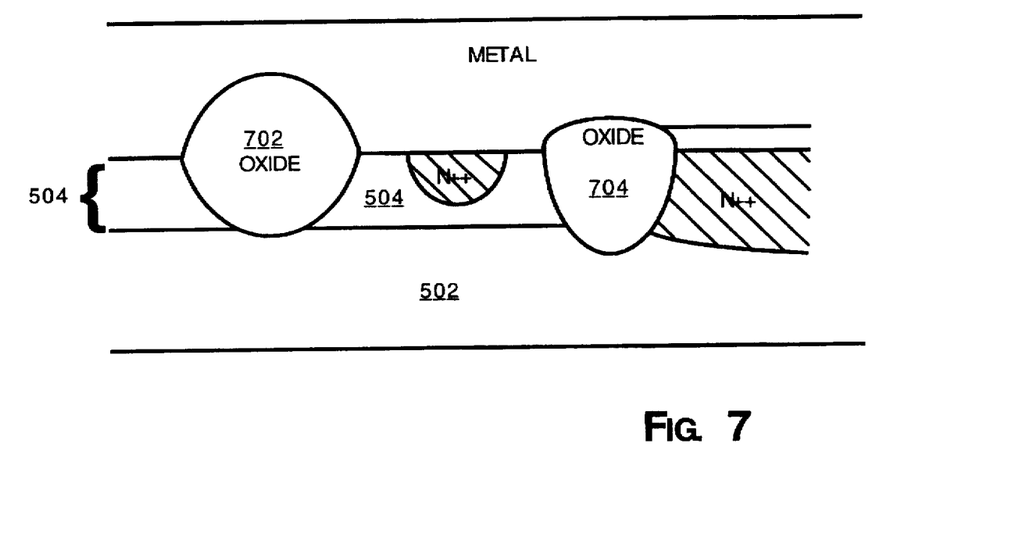
FIG. 7 illustrates, in another embodiment, a thin film ESD-protected capacitor structure without the optional isolation region.

FIG. 7 shows, in an alternate embodiment, a thin film ESD-protected capacitor structure in which the isolation region of 520 of FIG. 5 is replaced by an isolation region of oxide. In the structure of FIG. 7, oxide region 702 is grown through epi layer 504, thereby essentially isolating p-epi region 704 of the protection device from the remainder of p-epi layer 504.

The thin film ESD-protected capacitor structure of the present invention may advantageously be incorporated into RC networks to accomplish, for example, RC termination/filtering for communication purposes. Because of its relatively low inductance characteristic at high frequencies, RC networks utilizing the inventive thin film ESD-protected capacitor structure are particular suitable for use in modern high speed electronic devices such as computers and their peripherals or in cellular phones. The fact that the inventive thin film ESD-protected capacitor structures of the present invention lends themselves to proven semiconductor manufacturing techniques also facilitates the fabrication of entire RC networks on a single integrated circuit chip, with the attendant advantages in cost, size and speed.

Figure 8A:
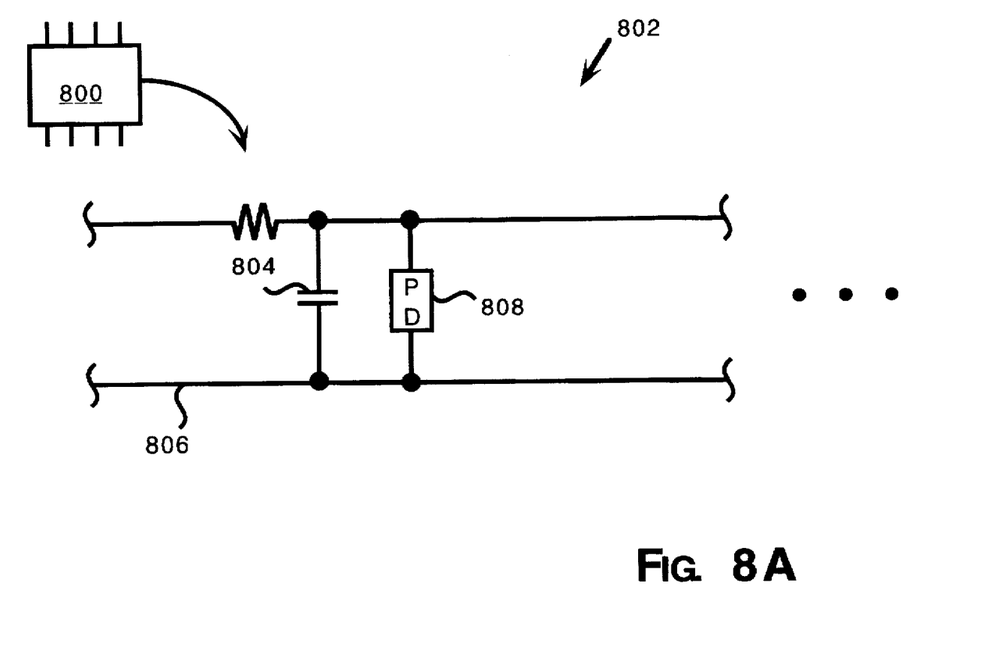
FIGS. 8A shows, for illustration purposes, an integrated circuit on which a plurality of RC networks, each of which comprises a single-pole filter, are implemented.

When employed as part of a device consisting of multiple RC networks, the common backside contact, e.g., backside contact 512 of FIG. 5, forms the common ground bus for coupling together all capacitors. FIGS. 8A shows, for illustration purposes, an integrated circuit (IC) 800 on which a plurality of RC networks, each of which comprises a single-pole filter 802, are implemented. In IC 800, capacitors 804 of the multiple RC networks are fabricated using the inventive technique disclosed herein. Further, they all share a common back side contact 806. A protection device 808, also fabricated in accordance with the inventive technique disclosed herein, is preferably furnished with each capacitor to protect it against ESD current.

Figure 8B:
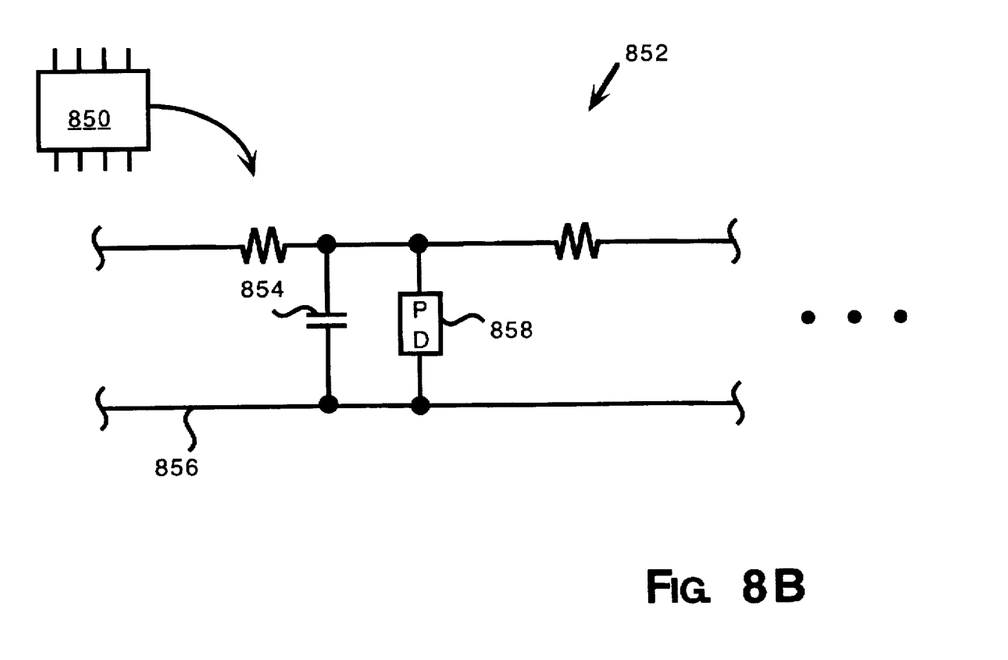
FIG. 8B shows, for illustration purposes, another integrated circuit on which a plurality of RC networks, each of which comprises a two-pole filter, are implemented.

FIG. 8B shows, for illustration purpose, another integrated circuit (IC) 850 on which a plurality of RCR networks, each of which comprises a two-pole filter 852, are implemented. Like IC 800, all capacitors 854 of the multiple RC networks of IC 850 are preferably fabricated using the inventive technique disclosed herein. Capacitors 854 share a common back side contact 856. A protection device 858, also fabricated in accordance with the inventive technique disclosed herein, is preferably furnished with each capacitor 854 to protect it against ESD current.

It should be borne in mind that the RC networks of FIGS. 8A and 8B are merely illustrative, and there exist other RC network configurations or even RLC combinations which may well employ the inventive thin film ESD-protected capacitor structure. In fact, it is contemplated that the inventive protection device disclosed herein may be employed independent of the capacitor to protect any kind of electronic circuitry that may be fabricated atop a highly doped substrate or as a stand-alone device for use in electronic systems. Given this disclosure, the adaptation of the inventive protection device to fit a particular application and circuit is well within the abilities of one skilled in the art.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A thin film protected capacitor structure having a thin film capacitor and a protection device, said thin film protected capacitor structure being fabricated on an integrated circuit wafer, said wafer having a low resistivity substrate disposed under an epitaxial layer, said low resistivity substrate being of a first type and said epitaxial layer being of a second type different from said first type, comprising:

a first heavily doped region in and through said epitaxial layer, said first heavily doped region being of said first type;

an oxide layer having a first oxide region disposed above said first heavily doped region, said first heavily doped region being in electrical contact with both said first oxide region and said low resistivity substrate to form a conducting path between an underside of said first oxide region and said low resistivity substrate through said epitaxial layer, whereby said first heavily doped region and said low resistivity substrate represent a first plate of said thin film capacitor;

a metal layer disposed above said first oxide region, a portion of said metal layer forming a second plate of said thin film capacitor, whereby said first oxide region representing an insulating dielectric between said first plate and said second plate; and a second heavily doped region formed in said epitaxial layer, said second heavily doped region having a thickness that is less than the thickness of said epitaxial layer, said second heavily doped region being of said first type and in electrical contact with said metal layer, whereby said second heavily doped region, said epitaxial layer, and said low resistivity substrate form said protection device.

2. The thin film protected capacitor structure of claim 1 wherein said first type represents a p-type and said second type represents an n-type.

3. The thin film protected capacitor structure of claim 1 wherein said first type represents an n-type and said second type represents a p-type.

4. The thin film protected capacitor structure of claim 1 further comprising a backside electrical contact coupled to said second plate, said backside electrical contact representing a terminal of said thin film capacitor.

5. The thin film protected capacitor structure of claim 1 further comprising:

a third heavily doped region in and through said epitaxial layer, said third heavily doped region being of said first type and in electrical contact with said low resistivity substrate; and a second oxide region of said oxide layer, said second oxide region being disposed between said metal layer and said third heavily doped region, whereby said third heavily doped region forms an isolation structure to isolate said protection device from other portions of said epitaxial layer.

6. The thin film protected capacitor structure of claim 5 wherein said second heavily doped region is in a spaced-apart relationship relative to said second oxide region.

7. The thin film protected capacitor structure of claim 5 further comprising a backside electrical contact coupled to said second plate, said backside electrical contact representing a terminal of said thin film capacitor.

8. The thin film protected capacitor structure of claim 1 wherein said thin film capacitor and said protection device are fabricated using a local oxidation process.

9. The thin film capacitor structure of claim 8 wherein said protection device is substantially annular.

10. The thin film protected capacitor structure of claim 1 wherein said thin film capacitor and said protection device are fabricated using a bipolar process.

11. The thin film protected capacitor structure of claim 1 further comprising a second oxide region of said oxide layer, said second oxide region being disposed between said metal layer and said low resistivity substrate through said epitaxial layer, whereby said second oxide region forms an isolation structure to isolate said protection device from other portions of said epitaxial layer.

12. The thin film protected capacitor structure of claim 10 wherein said second heavily doped region is in a spaced-apart relationship relative to said second oxide region.

13. A thin film capacitor fabricated on an integrated circuit wafer die, said wafer die having a low resistivity substrate disposed below an epitaxial layer, said low resistivity substrate being of a first type and said epitaxial layer being of a second type different from said first type, comprising:

a first heavily doped region in and through said epitaxial layer, said first heavily doped region being of said first type;

an oxide layer having a first oxide region disposed above said first heavily doped region, whereby said first heavily doped region is in electrical contact with both said first oxide region and said low resistivity substrate to form a conducting path between an underside of said first oxide region and said low resistivity substrate through said epitaxial layer; and a metal layer having a first metal region disposed above said first oxide region, wherein said first metal region forming a first plate of said thin film capacitor, said first heavily doped region and said low resistivity substrate representing a second plate of said thin film capacitor, said first oxide region layer representing an insulating dielectric between said first plate and said second plate.

14. The thin film capacitor of claim 13 wherein said first type represents a p-type and said second type represents an n-type.

15. The thin film capacitor of claim 13 wherein said first type represents an n-type and said second type represents a p-type.

16. The thin film capacitor of claim 13 further comprising a backside electrical contact coupled to said second plate, said backside electrical contact representing a conducting terminal of said thin film capacitor.

17. The thin film capacitor of claim 13 wherein said thin film capacitor is fabricated using a local oxidation process.

18. The thin film capacitor of claim 13 wherein said thin film capacitor is fabricated using a metal gate process MOS.

19. A method for fabricating an integrated circuit having therein a thin film protected capacitor structure on a wafer, said wafer having an epitaxial layer disposed above a low resistivity substrate, said low resistivity substrate being of a first type and said epitaxial layer being of a second type different from said first type, comprising:

implanting dopants of said first type into a first region of said epitaxial layer, thereby forming a first heavily doped region in and through said epitaxial layer, said first heavily doped region being of said first type and in electrical contact with said low resistivity substrate;

forming an oxide layer, said oxide layer having a first oxide region disposed above said first heavily doped region; and forming a metal layer, said metal layer having a first metal region disposed above said first oxide region, whereby said first metal region representing a first plate of a thin film capacitor of said thin film protected capacitor structure, said first oxide region representing an insulating dielectric layer of said thin film capacitor, and both said first heavily doped region and said low resistivity substrate representing a second plate of said thin film capacitor.

20. The method of claim 19 further comprising:

implanting dopants of said first type into a second region of said epitaxial layer, thereby forming a second heavily doped region in said epitaxial layer, said second heavily doped region being of said first type and having a thickness that is less than the thickness of said epitaxial layer;

electrically isolating a first epitaxial region of said epitaxial layer from other regions of said epitaxial layer, said first epitaxial region being disposed under said second heavily doped region; and electrically coupling a second region of said metal layer to said second heavily doped region, whereby said second heavily doped region, said first epitaxial region, and said low resistivity substrate form a protection device of said thin film protected capacitor structure.

21. The method of claim 20 wherein said step of electrically isolating said first epitaxial region comprises the step of implanting dopants of said first type into a third region of said epitaxial layer, thereby forming a third heavily doped region in and through said epitaxial layer, said third heavily doped region being of said first type and in electrical contact with said low resistivity substrate.

22. The method of claim 20 wherein said step of electrically isolating said first epitaxial region comprises the step of providing a first oxide region in and through said epitaxial layer, whereby said first oxide region acts to electrically isolate said first epitaxial region from said other regions of said epitaxial layer.

23. The method of claim 20 wherein said first type represents a p-type and said second type represents an n-type.

24. The method of claim 20 wherein said first type represents an n-type and said second type represents a p-type.

25. The method of claim 20 further comprising the step of electrically coupling a backside electrical contact to said second plate, said backside electrical contact representing a terminal of said thin film capacitor.

26. The method of claim 20 further comprising the step of electrically coupling a backside electrical contact to said low resistivity substrate, thereby forming a conducting path between said backside electrical contact, said second plate of said thin film capacitor, and said protection device.

* * * * *